United States Patent
Narui (10) Patent No.: US 8,374,044 B2
(45) Date of Patent: Feb. 12, 2013

(54) SEMICONDUCTOR DEVICE HAVING HIERARCHICALLY STRUCTURED BIT LINES AND SYSTEM INCLUDING THE SAME

(75) Inventor: Seiji Narui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 207 days.

(21) Appl. No.: 12/805,014

(22) Filed: Jul. 7, 2010

(65) Prior Publication Data
US 2011/0026348 A1 Feb. 3, 2011

(30) Foreign Application Priority Data
Jul. 30, 2009 (JP) ................................ 2009-177405

(51) Int. Cl.
*G11C 7/06* (2006.01)
(52) U.S. Cl. ................... 365/210.1; 365/230.03; 365/63
(58) Field of Classification Search .................. None
See application file for complete search history.

(56) References Cited

U.S. PATENT DOCUMENTS

| 5,608,668 A * | 3/1997 | Zagar et al. ................. 365/149 |
| 5,682,343 A | 10/1997 | Tomishima et al. |
| 7,088,626 B2 * | 8/2006 | Mori et al. ............... 365/189.11 |
| 2002/0085423 A1 * | 7/2002 | Tedrow et al. ........... 365/185.21 |

FOREIGN PATENT DOCUMENTS

JP 2000-260885 A 9/2000

* cited by examiner

*Primary Examiner* — Hoai V Ho
*Assistant Examiner* — James G Norman
(74) *Attorney, Agent, or Firm* — McGinn IP Law Group, PLLC (57) ABSTRACT

A semiconductor device includes a global bit line, a dummy global bit line that is shorter than the global bit line, a sense amplifier that amplifies a potential difference between the global bit line and the dummy global bit line, a plurality of memory blocks each including a hierarchy switch and a local bit line that is connected to the global bit line via the hierarchy switch, a dummy memory block that includes a dummy hierarchy switch and a dummy local bit line that is connected to the dummy global bit line via the dummy hierarchy switch, and a control circuit that activates any one of hierarchy switches and the dummy hierarchy switch. With this configuration, it is possible to obtain the same memory capacity between a memory mat located at an edge and the other memory mat.

18 Claims, 8 Drawing Sheets

SEMICONDUCTOR DEVICE HAVING HIERARCHICALLY STRUCTURED BIT LINES AND SYSTEM INCLUDING THE SAME

BACKGROUND OF THE INVENTION

1. Field of the Invention

The present invention relates to a semiconductor device, and more particularly relates to a semiconductor device having hierarchically structured bit lines. Furthermore, the present invention relates to a system including the semiconductor device.

2. Description of Related Art

Some semiconductor devices such as DRAM (Dynamic Random Access Memory) include local bit lines and global bit lines that are hierarchically structured (see U.S. Pat. No. 5,682,343). The local bit line corresponds to a low-order bit and is connected to a memory cell. On the other hand, the global bit line corresponds to a high-order bit and is connected to a sense amplifier. With hierarchized bit lines, it is possible to increase the number of memory cells allocated to one sense amplifier, while shortening a line length of the local bit line that has a relatively high electrical resistance.

A semiconductor device described in U.S. Pat. No. 5,682,343, adopts a so-called open bit architecture. That is, a pair of global bit lines connected to a sense amplifier is allocated to different memory mats from each other. As is widely known, unlike a folded bit line architecture, because word line noise is not canceled in the open bit architecture, the word line noise is superimposed on a bit line of an access side. To deal with this problem, as shown in FIGS. 18 and 19 of U.S. Pat. No. 5,682,343, a dummy word line is used to cancel word line noise.

In case of the open bit architecture, a process for memory mats at both edges in a bit line direction becomes a problem. That is, in the open bit architecture, when a certain memory mat is selected, memory mats at both sides adjacent to the selected memory mat in the bit line direction are used as reference sides. However, for a memory mat that is located at an edge, only an adjacent memory mat exists in the bit line direction at one side. Therefore, although the memory mat located at the edge occupies the same dimension as a normal memory mat, its memory capacity becomes a half of a memory capacity of the normal memory mat.

To deal with this problem, for example, as shown in FIG. 3 of Japanese Patent Application Laid-open No. 2000-260885, a measure has been proposed in which a bit line is replicated for a memory mat that is located at an edge. The characteristic of two bit lines at an access side and a reference side to be input to a sense amplifier 3a that is sandwiched by a dummy memory cell array 2 and a normal memory cell array 1 is that a length a of a bit line included in the normal memory cell array 1 at the access side is equal to a length b of a bit line (a replicated line 11) included in the dummy memory cell array 2 at the reference side.

By replicating the bit line included in the dummy memory cell array 2 at the reference side (b=1/2a) in a cell array of the open bit line structure, a reduction of a dimension of a memory cell array arranged at the edge (an edge mat) is realized.

However, in a semiconductor device described in Japanese Patent Application Laid-open No. 2000-260885, the memory mat (the dummy memory cell array 2) that is located at the outermost edge has a configuration different from that of the other memory mat (the normal memory cell array 1), and the memory capacity (the number of memory cells) is a half of the number of memory cells of the other memory mat. In other words, attention needs to be paid to a fact that the number of memory cells to be connected to a bit line of an access side (four) and the number of memory cells to be connected to a bit line of a reference side (four), in which these memory cells are all connected to one sense amplifier 3a, are equal to each other. Therefore, an address allocation and the like are different from those of the other memory mat, leading to a complicated design. Furthermore, in the semiconductor device described in Japanese Patent Application Laid-open No. 2000-260885, because bit lines are not hierarchized, a layout to be taken is not clear if a hierarchized bit line structure is adopted. Specifically, when the memory capacity of the normal memory cell array 1 (the number of cells=a) increases, the memory capacity of the dummy memory cell array 2 (the number of cells=b) also increases, followed by an increase of the length b of the corresponding dummy bit line. That is, even if the hierarchized bit line structure is combined with the semiconductor device described in this conventional technique, the size of the dummy memory cell array 2 depends on the memory capacity of the normal memory cell array 1.

SUMMARY

In one embodiment, there is provided a semiconductor device comprising: a first global bit line; a dummy global bit line; a plurality of first memory blocks that are arranged in a first direction, each of the first memory blocks including a first hierarchy switch that is connected to the first global bit line, and a first local bit line that is connected to the first global bit line via the first hierarchy switch; a dummy memory block including a dummy hierarchy switch that is connected to the dummy global bit line, and a first dummy local bit line that is connected to the dummy global bit line via the dummy hierarchy switch; a first sense amplifier that is arranged between the first memory blocks and the dummy memory block, and amplifies a potential difference between the first global bit line and the dummy global bit line; and a control circuit that controls the first hierarchy switches and the dummy hierarchy switch such that any one of a plurality of first hierarchy switches and the dummy hierarchy switch are brought into on state, wherein a total number of memory cells connected to a plurality of the first local bit lines corresponding to the first sense amplifier is larger than a total number of dummy memory cells connected to the dummy local bit line corresponding to the first sense amplifier, a length of the first local bit line is substantially equal to a length of the first dummy local bit line, and a length of the first global bit line is longer than a length of the dummy global bit line.

According to the present invention, the bit lines are hierarchized, and a memory mat (a normal memory array to which an external address is allocated) is constituted by a plurality of memory blocks each having a predetermined number of memory cells. The capacity of the memory mat increases by increasing the number of the memory blocks. However, a dummy area in which a reference side bit line corresponding to a sense amplifier that senses a global bit line included in one memory mat is included is one dummy memory block corresponding to the single memory block. That is, the size of the area of the dummy memory block has nothing to do with the size of the area of the memory mat. As a result, an increase of the dimension can be suppressed. Because the bit lines are hierarchized, a parasitic CR including a resistance component of the global bit line becomes much smaller than a resistance component of a local bit line to which a large number of memory cells are attached or a hierarchy switch that is arranged at an arrangement pitch of the local bit line. Therefore, it is possible to make a parasitic CR distributed constant including a component of the global bit line that is relatively long and a parasitic CR distributed constant including a component of the dummy global bit line that is relatively short substantially equal to each other. As a result, even when configuring a memory mat in which a plurality of first memory blocks are located at an edge, it is possible to secure the same memory capacity as that of the other memory mat by adding a dummy memory block.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of the technical concept for solving the object of the present invention is described below. Note that the claimed contents of present invention are not limited to this technical concept, and are defined by the descriptions of the appended claims. That is, the technical concept of the present invention relates to a semiconductor device of a hierarchized open bit architecture, in which one dummy memory block which is one of memory blocks is allocated to a memory mat at an edge among memory mats each including a plurality of memory blocks. With this configuration, it is possible to suppress the number of dummy memory blocks even when the number of memory blocks increases, and to handle the memory mat at the edge in the same way of a normal memory mat.

Although a length of a dummy global bit line allocated to the dummy memory block is shorter than a length of a global bit line allocated to the normal memory block, a parasitic CR including a resistance component of the global bit line can take a much smaller resistance (a time constant) than a resistance component of a local bit line to which a large number of memory cells are attached or a hierarchy switch that is arranged at an arrangement pitch of the local bit line. Therefore, in a parasitic CR distributed constant viewed from a sense amplifier, a component of the hierarchy switch and a local bit line ahead becomes dominant. Furthermore, the total number of memory cells to be connected to one local bit line pertaining to the sense amplifier is the same as the total number of dummy memory cells to be connected to a related dummy local bit line. Therefore, even when the length of the dummy global bit line is short, it is possible to reproduce the parasitic CR distributed constant of the global bit line in a substantially precise manner. That is, it is possible to provide optimal sensing conditions (electrical properties) for the sense amplifier. In addition, the total number of memory cells to be connected to a plurality of the local bit line pertaining to the sense amplifier can be larger than the total number of dummy memory cells to be connected to the related dummy local bit line. As a result, even when the number of memory blocks increases (the number of memory cells increases), it is possible to keep one dummy memory block.

A preferred embodiment of the present invention is explained below with reference to the accompanying drawings.

Figure 1:
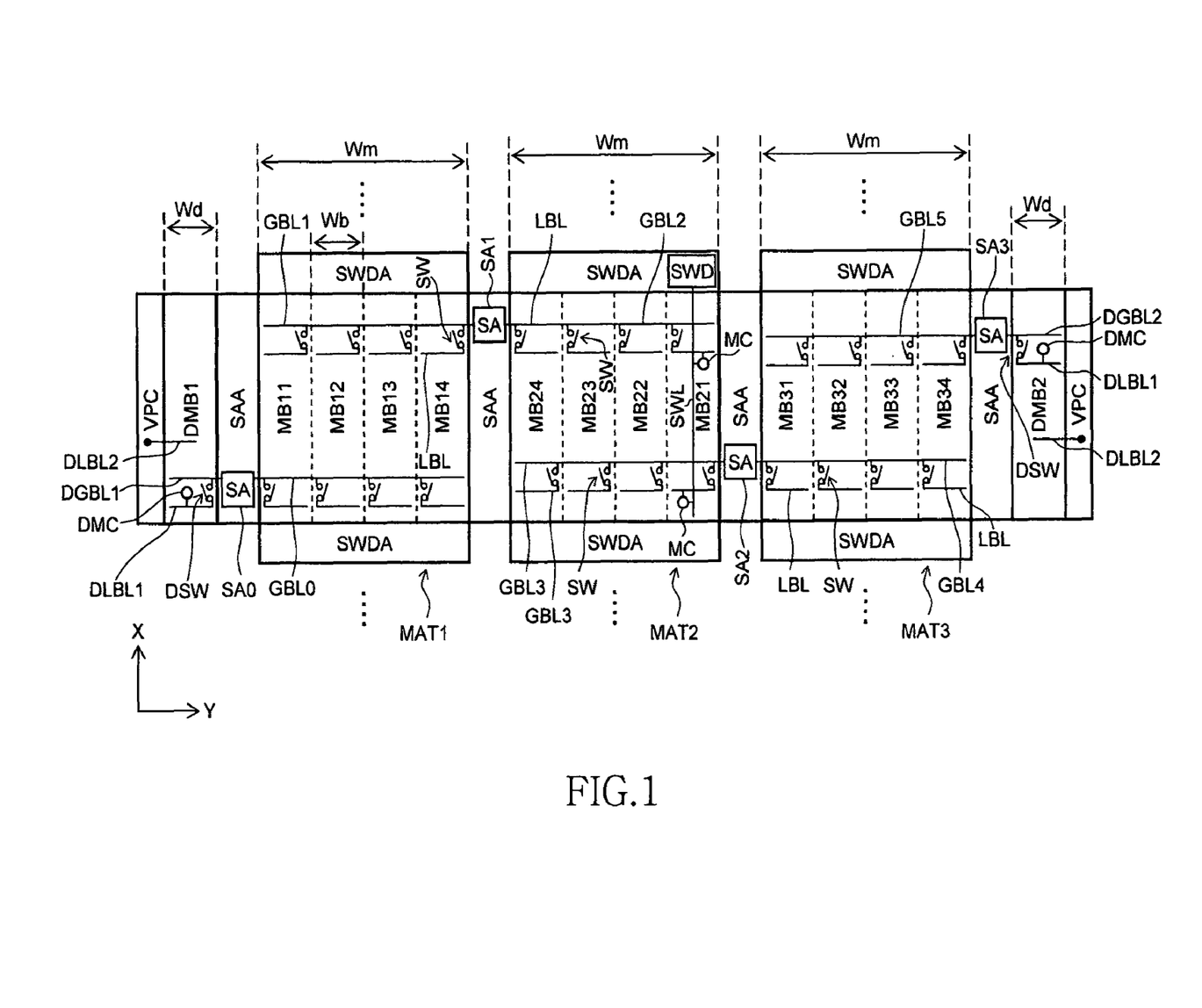
FIG. 1 is a schematic diagram for explaining a memory mat structure of a semiconductor device according to an embodiment of the present invention.

FIG. 1 is a schematic diagram for explaining a memory mat structure of a semiconductor device according to an embodiment of the present invention. Although a large number of memory mats are laid out in a matrix form in a word line direction (an X direction) and a bit line direction (a Y direction; a first direction) in an actual case, only three memory mats MAT1 to MAT3 that are arranged in a row in the bit line direction (the Y direction) are shown in FIG. 1. In the present example, the memory mats MAT1 and MAT3 are located at both edges, respectively. In the following explanations, when it is not necessary to designate a specific memory mat or when it is necessary to refer all the memory mats in a collective manner, the memory mats MAT1 to MAT3 are simply referred to as "memory mat MAT". An area composed of a plurality of sense amplifier arrays and a plurality of memory mats arranged in the first direction is referred to as "memory array".

As shown in FIG. 1, a sub-word driver array SWDA is provided at both sides of the memory mat MAT in the X direction. The sub-word driver array SWDA includes a plurality of sub-word drivers SWD, and each of the sub-word drivers SWD drives a sub-word line SWL provided in the memory mat MAT. The sub-word line SWL extends in the X direction in the memory mat MAT, and is used in selecting a memory cell MC. Only one sub-word line SWL in the memory mat MAT2 is shown in FIG. 1. In one memory mat, the sub-word line SWL output from the sub-word driver array SWDA at the upper side and the sub-word line SWL output from the sub-word driver array SWDA at the lower side (not shown) are alternately arranged in a skewered manner. The sub-word lines SWL are also output to adjacent memory mats that are arranged in the X direction from the sub-word driver array SWDA at each of the upper side and the lower side. The memory cell is a $4F^2$ memory cell as an example, which is described later with reference to FIG. 5, and is a 1-intersection 1-cell type in which a memory cell is arranged at every intersections of the sub-word line SWL with a local bit line LBL (described later).

Furthermore, a sense amplifier array SAA is arranged at both sides of the memory mat MAT in the Y direction. The sense amplifier array SAA includes a plurality of sense amplifiers SA, and each of the sense amplifiers SA amplifies a potential difference between a pair of global bit lines GBL (which are composed of the global bit lines arranged in memory mats at both sides of the sense amplifier) or a potential difference between a global bit line GBL and a dummy global bit line DGBL. In FIG. 1, a sense amplifier SA0 located between a dummy memory block DMB1 and the memory mat MAT1, a sense amplifier SA1 located between the memory mat MAT1 and the memory mat MAT2, a sense amplifier SA2 located between the memory mat MAT2 and the memory mat MAT3, and a sense amplifier SA3 located between the memory mat MAT3 and a dummy memory block DMB2 are only shown. A circuit configuration of the sense amplifier SA is not limited to any particular format. For example, a typical flip-flop circuit can be used to form the sense amplifier SA. The pair of the global bit lines GBL is high-order bit lines arranged in the memory mats MAT adjacent to each other in the Y direction, respectively, extending in the Y direction.

As shown in FIG. 1, each of the global bit lines GBL extends in the Y direction on a corresponding memory mat MAT. Specifically, global bit lines GBL0 and GBL1 are allocated to the memory mat MAT1, global bit lines GBL2 and GBL3 are allocated to the memory mat MAT2, and global bit lines GBL4 and GBL5 are allocated to the memory mat MAT3. Therefore, a line length (in the Y direction) of each of the global bit lines GBL is substantially equal to a width Wm of the memory mat MAT in the Y direction.

On the other hand, each of the dummy global bit lines DGBL extends in the Y direction on a corresponding dummy memory block DMB. Therefore, a line length of each of the dummy global bit lines DGBL is substantially equal to a width Wd of the dummy memory block DMB in the Y direction.

The dummy memory block DMB1 is a dummy memory block arranged on the outer side in the Y direction (further left side) from the memory mat MAT1 that is located at one edge in the Y direction (left side). Similarly, the dummy memory block DMB2 is a dummy memory block arranged on the outer side in the Y direction (further right side) from the memory mat. MAT3 that is located at the other edge in the Y direction (right side). Each of the dummy memory blocks DMB1 and DMB2 has substantially the same circuit configuration as one memory block MB. Therefore, as shown in FIG. 1, the width Wd of each of the dummy memory blocks DMB1 and DMB2 in the Y direction is narrower than the width Wm of each of the memory mats MAT1 to MAT3 in the Y direction, while being substantially equal to a width Wb of one memory block MB in the Y direction.

As shown in FIG. 1, in the present embodiment, each of the memory mats MAT is divided into four memory blocks MB1 to MB4 that are arranged in a row in the Y direction. However, the number of the memory blocks is not limited to four, because the number constitutes the memory capacity of the semiconductor device. In the following explanations, when it is not necessary to designate a specific memory block or when it is necessary to refer all the memory blocks in a collective manner, the memory blocks MB1 to MB4 may be simply referred to as "memory block MB". As described above, the width Wb of the memory block MB in the Y direction is substantially equal to the width Wd of the dummy memory block DMB in the Y direction.

The memory block MB includes a plurality of local bit lines LBL that are arranged extending in the Y direction. The local bit lines LBL are low-order bit lines with respect to the high-order global bit lines GBL. The memory cell MC is arranged at every intersection of the local bit lines LBL and the sub-word lines SWL. Therefore, when a predetermined sub-word line SWL is activated, the memory cell MC corresponding to the activated sub-word line SWL is selected, by which data is exchanged via the local bit line LBL.

Furthermore, each of the dummy memory blocks DMB1 and DMB2 includes a plurality of dummy local bit lines DLBL1 and DLBL2 each extending in the Y direction. Although the dummy local bit line DLBL1 is a dummy line replicating the local bit line LBL, unlike the regular memory mat, the sub-word line driver SWDA is not connected to a sub-word line (not shown) that intersects with the dummy local bit line DLBL1. On the other hand, the same number of dummy memory cells DMC as the memory cells MC allocated to one local bit line LBL is allocated to the dummy local bit line DLBL1. In this manner, because the sub-word line is not provided although a plurality of dummy memory cells DMC are allocated to the dummy local bit line DLBL1, these dummy memory cells are not connected. That is, the dummy memory cells DMC simply function as a load with respect to the dummy local bit line DLBL. With this configuration, a load of the local bit as the reference side is precisely reproduced. An external address is not allocated to the dummy memory cell DMC.

On the other hand, the dummy local bit line DLBL2 corresponds to one local bit line LBL pertaining to the global bit line GBL3 of a regular memory mat. A fixed potential is applied to the dummy local bit line DLBL2 by an equalizer circuit VPC. The fixed potential applied by the equalizer circuit VPC is set to a pre-charge potential for the global bit line GBL and the local bit line LBL. Although it is not essential to provide the dummy local bit line DLBL2 in the present invention, because providing the dummy local bit line DLBL2 makes a line pitch of the dummy local bit line DLBL and a line pitch of the local bit line LBL equal to each other, it becomes possible to match process conditions of the memory block and the dummy memory block each other at the time of manufacturing.

As shown in FIG. 1, a hierarchy switch SW is arranged between each of the local bit lines LBL and the global bit line GBL. One global bit line GBL is connected to any one of the four local bit lines LBL that are allocated to the global bit line GBL by the hierarchy switch SW. The hierarchy switch SW can be configured with an N-channel MOS transistor. Alternatively, the hierarchy switch SW can also be configured with a CMOS transfer gate. The connection scheme includes a first case where one global bit line GBL and one local bit line LBL are connected to each other in a one-to-one relationship and a second case where one global bit line GBL is connected to a plurality of (n) local bit lines LBL in one-to-n relationship. An arrangement pitch of the local bit lines LBL is equal to or less than 2F with a $4F^2$ type memory cell including an access transistor of a vertical transistor structure (where F is the minimum feature size). The hierarchy switch SW is attached to one local bit line LBL, and therefore a size (current drivability) of the hierarchy switch SW that is composed of a vertical transistor structure like the access transistor is small, and the ON resistance in the ON state is large. Details on this aspect are described later with an explanation of FIG. 6.

Similarly, a dummy hierarchy switch DSW is arranged between the dummy local bit line DLBL1 and the dummy global bit line DGBL. The dummy local bit line DLBL and the dummy global bit line DGBL are corresponding to each other in one-to-one relationship, which means that a plurality of dummy local bit lines DLBL are allocated to one dummy global bit line DGBL.

Figure 2:
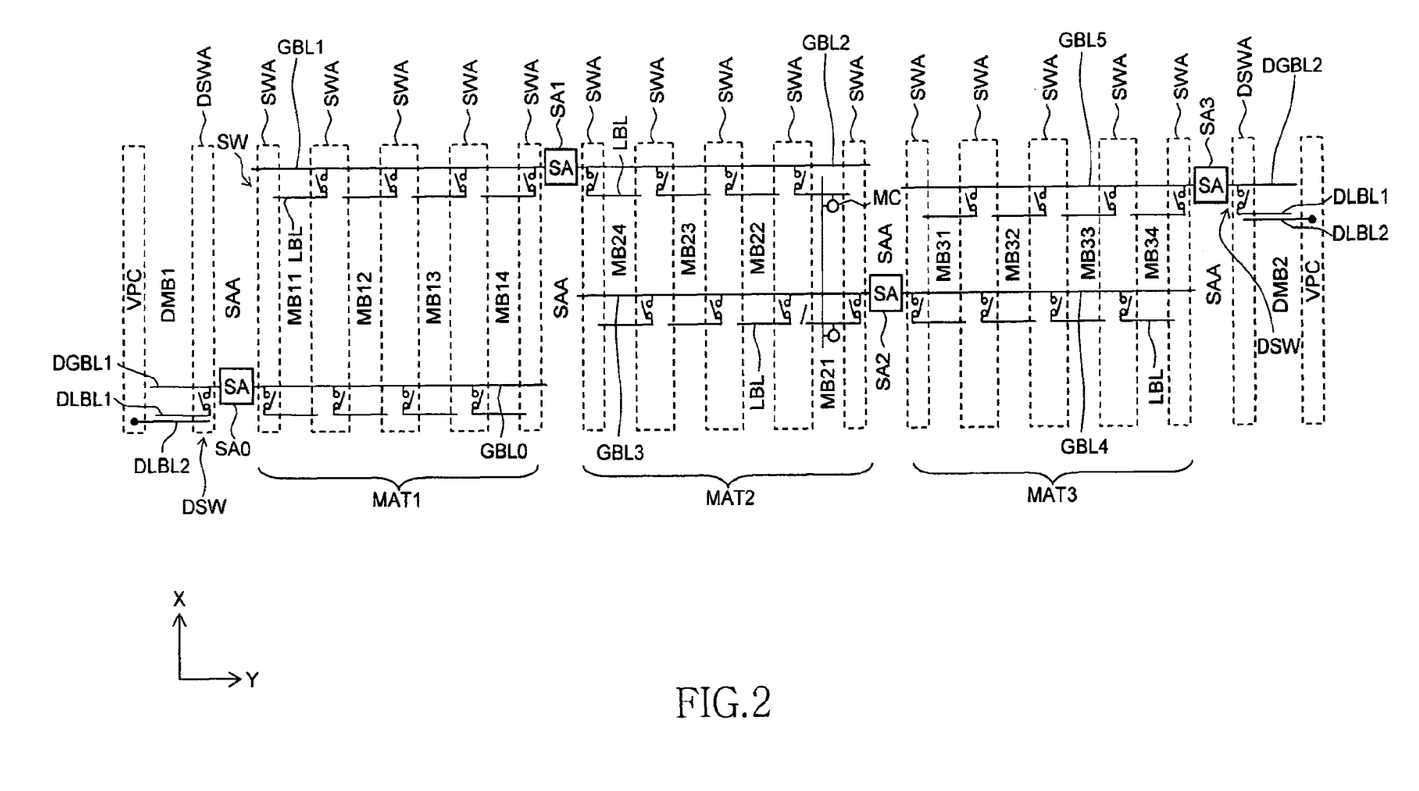
FIG. 2 is circuit diagram for explaining a hierarchy structure of the bit lines in detail.

FIG. 2 is a circuit diagram for explaining a hierarchy structure of the bit lines in detail.

As shown in FIG. 2, the sense amplifier SA1 between the memory mats MAT1 and MAT2 is connected to global bit lines GBL1 and GBL2. The global bit lines GBL1 and GBL2 are allocated to the memory mats MAT1 and MAT2, respectively. Similarly, the sense amplifier SA2 between the memory mats MAT2 and MAT3 is connected to global bit lines GBL3 and GBL4. The global bit lines GBL3 and GBL4 are allocated to the memory mats MAT2 and MAT3, respectively.

One of the pair of the global bit lines GBL is an access side and the other is a reference side. A potential difference between the pair of the global bit lines is amplified by the sense amplifier SA. The access side is a side that is connected to the target memory cell MC for a read operation or a write operation (the sub-word line SWL is activated so that information of the memory cell MC is provided to a corresponding local bit line LBL), and the reference side is a side that is not connected to the target memory cell MC for the read operation or the write operation. In the semiconductor device according to the present invention, the global bit line GBL of the reference side is not connected to a dummy cell, either. However, in the present invention, although it is possible to connect the global bit line GBL of the reference side to a dummy cell, it is not really necessary as described later.

Furthermore, the sense amplifier SA0 that is arranged between the dummy memory block DMB1 and the memory mat MAT1 is connected to a dummy global bit line DGBL1 and the global bit line GBL0. Similarly, the sense amplifier SA3 that is arranged between the memory mat MAT3 and the dummy memory block DMB2 is connected to the global bit line GBL5 and a dummy global bit line DGBL2. In a pair of the global bit line GBL and the dummy global bit line DGBL, the global bit line GBL is the access side, and the dummy global bit line DGBL is the reference side, with no reverse relationship.

As shown in FIG. 2, the pair of the global bit lines GBL are respectively allocated to two memory mats MAT that are arranged in a row across the sense amplifier array SAA in the Y direction. Therefore, in case the global bit line GBL included in one memory mat MAT is set as access side, the global bit line GBL included in the other memory mat MAT that is arranged in a row is to be set as the reference side. For example, when the memory mat MAT2 is selected, by which the global bit lines GBL2 and GBL3 become the access side, the global bit lines GBL1 and GBL4 included in the memory mats MAT1 and MAT3, respectively, become the reference side. One of the features of the present invention in this case is that, when a memory block MB14 becomes the access side, the dummy memory block DMB1 and a memory block MB24 become the reference side. With reference to the sense amplifier SA0, the global bit line GBL0 (the corresponding local bit line LBL to which an accessed cell is connected) and the dummy global bit line DGBL1 (the corresponding dummy local bit line DLBL1) make a pair. With reference to the sense amplifier SA1, the global bit line GBL1 (the corresponding local bit line LBL to which an accessed cell is connected) and the global bit line GBL2 (the corresponding dummy local bit line DLBL1 to which a non-accessed cell is connected) make a pair.

A load model (a distributed constant model) in each memory block MB and a load model (a distributed constant model) of the dummy memory block DMB are equal to each other, and the load model of the global bit line has less influence than the load model of the local bit line. It is because a component due to a hierarchy switch and a local bit line ahead is dominant in the parasitic CR distributed constant viewed from each sense amplifier.

As shown in FIG. 2, a hierarchy switch array SWA composed of a plurality of hierarchy switches SW is arranged between two memory blocks MB that are adjacent to each other in the Y direction and between a memory block MB and a sense amplifier array SAA. Specifically, the hierarchy switch array SWA is arranged at both sides of the memory block MB in the Y direction, and a plurality of local bit lines LBL arranged in the X direction are connected to the hierarchy switches SW arranged at both sides in the Y direction in an alternate manner. Furthermore, a dummy hierarchy switch array DSWA composed of a plurality of dummy hierarchy switches DSW is arranged between the dummy memory block DMB and the sense amplifier array SAA.

Figure 3A:
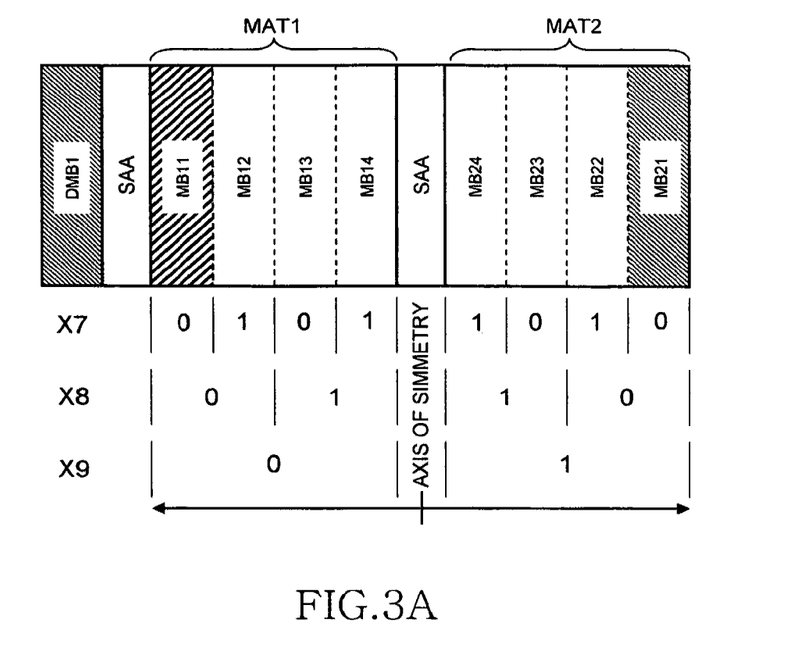
FIG. 3A is explanatory diagrams of a relationship between a memory block that becomes the access side and a memory block that becomes the reference side, where one memory block is accessed.
Figure 3B:
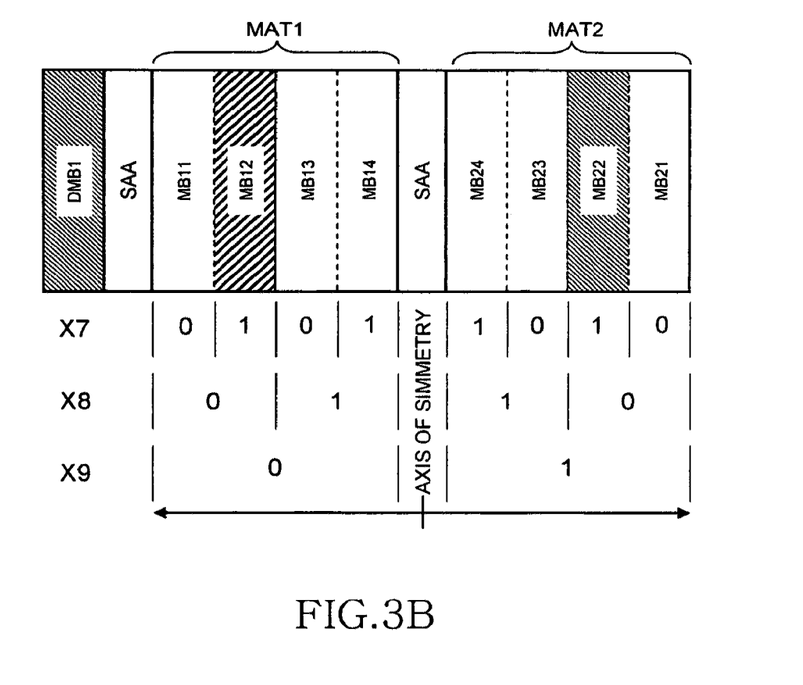
FIG. 3B is explanatory diagrams of a relationship between a memory block that becomes the access side and a memory block that becomes the reference side, where another memory block is accessed.

FIGS. 3A and 3B are explanatory diagrams of a relationship between a memory block that becomes the access side and a memory block that becomes the reference side, where FIG. 3A shows a case where the memory block MB11 is accessed, and FIG. 3B shows a case where a memory block MB12 is accessed.

In the example shown in FIGS. 3A and 3B, the memory mat MAT is selected by a bit X9 of a row address, and the memory block MB is selected by bits X7 and X8 of the row address. Specifically, as shown in FIG. 3A, if the bits X9 to X7 are "000", the memory block MB11 is selected, and as shown in FIG. 3B, if the bits X9 to X7 are "001", the memory block MB12 is selected. As shown in FIGS. 3A and 3B, in the present embodiment, the address allocation of the memory block MB is allocated symmetrically with respect to the sense amplifier array SAA, the significance of which is described later.

In FIGS. 3A and 3B, a diagonally right up hatching is applied on the memory block at access side, and a diagonally left up hatching is applied on the memory block MB and the dummy memory block DMB at reference side. For example, as shown in FIG. 3A, when the memory block MB11 is the access side, the memory block MB21 and the dummy memory block DMB1 are the reference side, and as shown in FIG. 3B, when the memory block MB12 is the access side, a memory block MB22 and the dummy memory block DMB1 are the reference side.

Similarly, although not shown in FIGS. 3A and 3B, when a memory block MB13 is the access side, a memory block MB23 and the dummy memory block DMB1 are the reference side, and when the memory block MB14 is the access side, the memory block MB24 and the dummy memory block DMB1 are the reference side.

In this manner, a positional relationship between the memory block MB that becomes the access side and the memory block MB that becomes the reference side becomes a mirror relationship with respect to the corresponding sense amplifier array SAA as the axis of symmetry. On the other hand, regardless of the memory blocks MB11 to MB14 included in the memory mat MAT1, whichever is the access side, the dummy memory block DMB1 is always used as the reference side.

Figure 4:
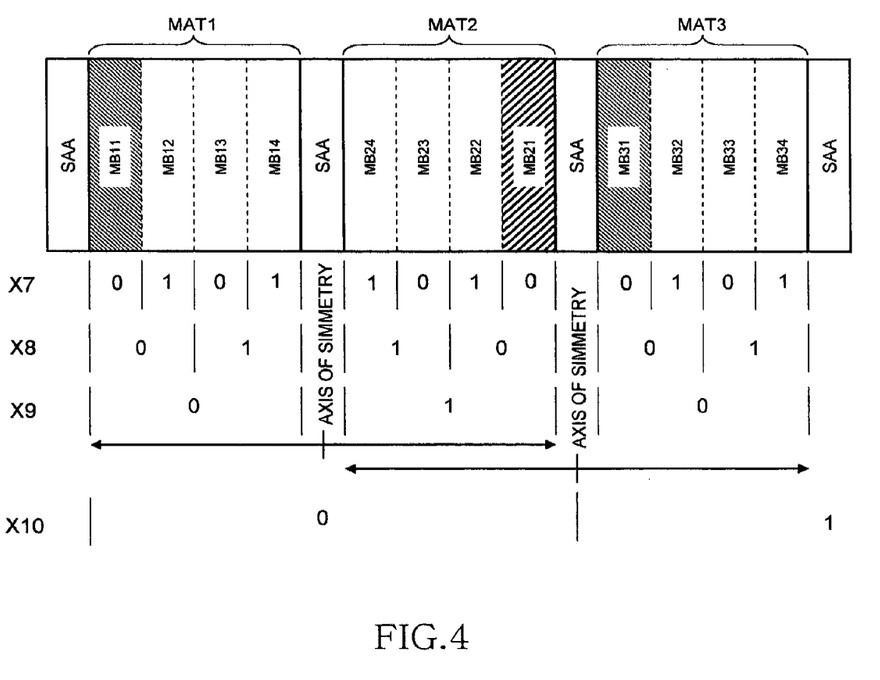
FIG. 4 is another schematic diagram for explaining the relationship between the memory block that becomes the access side and the memory block that becomes the reference side.

FIG. 4 is another schematic diagram for explaining the relationship between the memory block that becomes the access side and the memory block that becomes the reference side.

In the example shown in FIG. 4, the memory mat MAT is selected by bits X9 and X10 of a row address, and the memory block MB is selected by bits X7 and X8 of the row address. Although a portion of a bit X11 and above is also used to select the memory mat MAT because there are a large number of memory mats MAT in an actual case, it is omitted in the present embodiment for simplicity.

As shown in FIG. 4, in the present embodiment, the address allocation of the memory block MB is symmetric with respect to the sense amplifier array SAA. That is, in two memory mats MAT that are adjacent to each other in the Y direction, logics of the bits X7 and X8 of the row address used to select the memory block MB are symmetric with respect to the sense amplifier array SAA. In addition, in the two memory mats MAT that are adjacent to each other in the Y direction, either one of the bits X9 and X10 of the row address is inverted. Therefore, only either one of the bits X9 and X10 of the row address is different in the two memory blocks MB that are located in symmetric positions with respect to the sense amplifier array SAA. For example, only a logic of the bit X9 of the allocated row address is inverted between the memory block MB11 and the memory block MB21, and only a logic of the bit X10 of the allocated row address is inverted between the memory block MB21 and the memory block MB31.

One of the memory blocks MB that are located symmetrically with respect to the sense amplifier array SAA becomes the access side, and the other becomes the reference side. This makes parasitic CR models of the global bit lines GBL of the access side and the reference side equal to each other, from which it is possible to achieve a high sensing sensitivity even when a line length of the global bit line GBL is long. Although it is not particularly limited, it is preferable that an address allocation of the sub-word line SWL should also be symmetric with respect to the sense amplifier array SAA.

Figure 5:
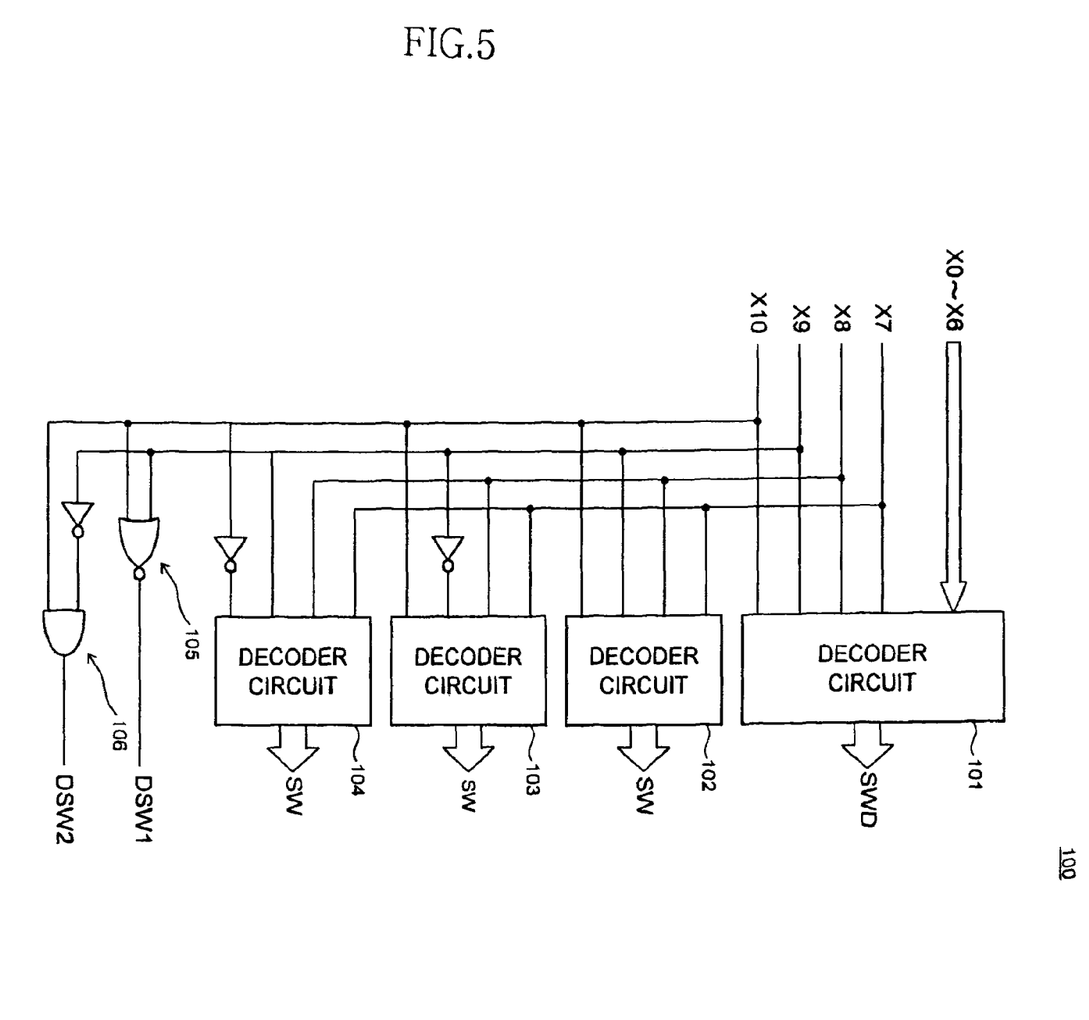
FIG. 5 is a block diagram of a control circuit for selecting the sub-word driver, the hierarchy switch, and the dummy hierarchy switch.

FIG. 5 is a block diagram of a control circuit 100 for selecting the sub-word driver SWD, the hierarchy switch SW, and the dummy hierarchy switch DSW.

As shown in FIG. 5, the control circuit 100 includes decoder circuits 101 to 104 and logic circuits 105 and 106. The decoder circuit 101 is a decoder circuit for selecting a sub-word driver SWD, which receives a row address X0 to X10 (or more) for which an access is requested and selects any one of the sub-word lines SWL based on the received row address. Among the row address X0 to X10 (or more), a portion of a bit X9 and above is used to select a memory mat MAT, a portion including bits X7 and X8 is used to select a memory block MB included in the selected memory mat MAT, and a portion including bits X0 to X6 is used to select a sub-word driver SWD included in the selected memory block MB. With this configuration, only one of the sub-word lines SWL is selected in at least three memory mats MAT that are arranged in a row in the Y direction. For example, in FIG. 4, a case where the sub-word line SWL in the memory block MB21 on which the diagonally right up hatching is applied is selected is shown. That is, the memory block MB21 is an access side block.

Each of the decoder circuits 102 to 104 is a decoder circuit for selecting a hierarchy switch SW, which receives the row address X7 to X10 (or more) for which the access is requested and connects any one of the local bit lines LBL to the global bit line GBL based on the received row address. Among these decoder circuits, the decoder circuit 102 is used to connect a local bit line LBL included in the access side block to the global bit line GBL, to which the row address X7 to X10 (or more) is input as it is. Therefore, the memory block MB that is selected by the decoder circuit 102 is the same as the access side block that is selected by the decoder circuit 101. As described above, the memory block MB21 is the access side block in the example shown in FIG. 4.

On the other hand, each of the decoder circuits 103 and 104 is used to connect a local bit line LBL included in the reference side block to the global bit line GBL. Specifically, although the row address X7 to X10 (or more) is input to each of the decoder circuits 103 and 104, a logic of the bit X9 that is input to the decoder circuit 103 is inverted, and a logic of the bit X10 that is input to the decoder circuit 104 is inverted. As a result, each of the memory blocks MB selected by the decoder circuits 103 and 104 becomes the reference side block that is located in a mirror arrangement with respect to the access side block when the sense amplifier array SAA is taken as the axis of symmetry. In the example shown in FIG. 4, the memory blocks MB11 and MB31 on which the diagonally left up hatching is applied are the reference side blocks.

As shown in FIG. 4, the memory block MB21 and the memory block MB11 are allocated symmetrically with respect to the sense amplifier SAA with the same row address except that the bit X9 is inverted. Similarly, the memory block MB21 and the memory block MB31 are allocated symmetrically with respect to the sense amplifier SAA with the same row address except that the bit X10 is inverted.

Meanwhile, the logical circuits 105 and 106 are used to connect the dummy local bit line DLBL1 included in the dummy memory block DMB to the dummy global bit line DGBL. Specifically, when both of the bits X9 and X10 of the row address are "0", the logical circuit 105 activates a dummy hierarchy switch DSW1 included in the dummy memory block DMB1. In this case, any one of the memory blocks MB11 to MB14 included in the memory mat MAT1 becomes the access side. Which one of the memory blocks MB11 to MB14 is selected is no object. Similarly, when the bits X9 and X10 of the row address are "0" and "1", respectively, the logical circuit 106 activates a dummy hierarchy switch DSW2 included in the dummy memory block DMB2. In this case, any one of the memory blocks MB31 to MB34 included in the memory block MAT3 becomes the access side. Which one of the memory blocks MB31 to MB34 is selected is no object.

In this manner, when the memory mat MAT1 or the memory mat MAT3 that are located at the edge is selected, the dummy hierarchy switch DSW of the dummy memory block DMB adjacent to the selected memory mat is activated, by which the dummy global bit line DGBL and the dummy local bit line DLBL1 are connected to each other. The parasitic CR distributed constant of the dummy global bit line DGBL that is connected to the dummy local bit line DLBL1 and the parasitic CR distributed constant of the global bit line GBL that is used as the reference side are substantially equal to each other. It is because, although the length of the dummy global bit line DGBL is shorter than the length of the global bit line GBL, a component due to the local bit line LBL (the dummy local bit line DLBL1) and the hierarchy switch SW (the dummy hierarchy switch DSW) is dominant in the parasitic CR distributed constant viewed from the sense amplifier SA because the global bit line GBL and the dummy global bit line DGBL are formed by using a line layer having a low resistance.

Figure 6:
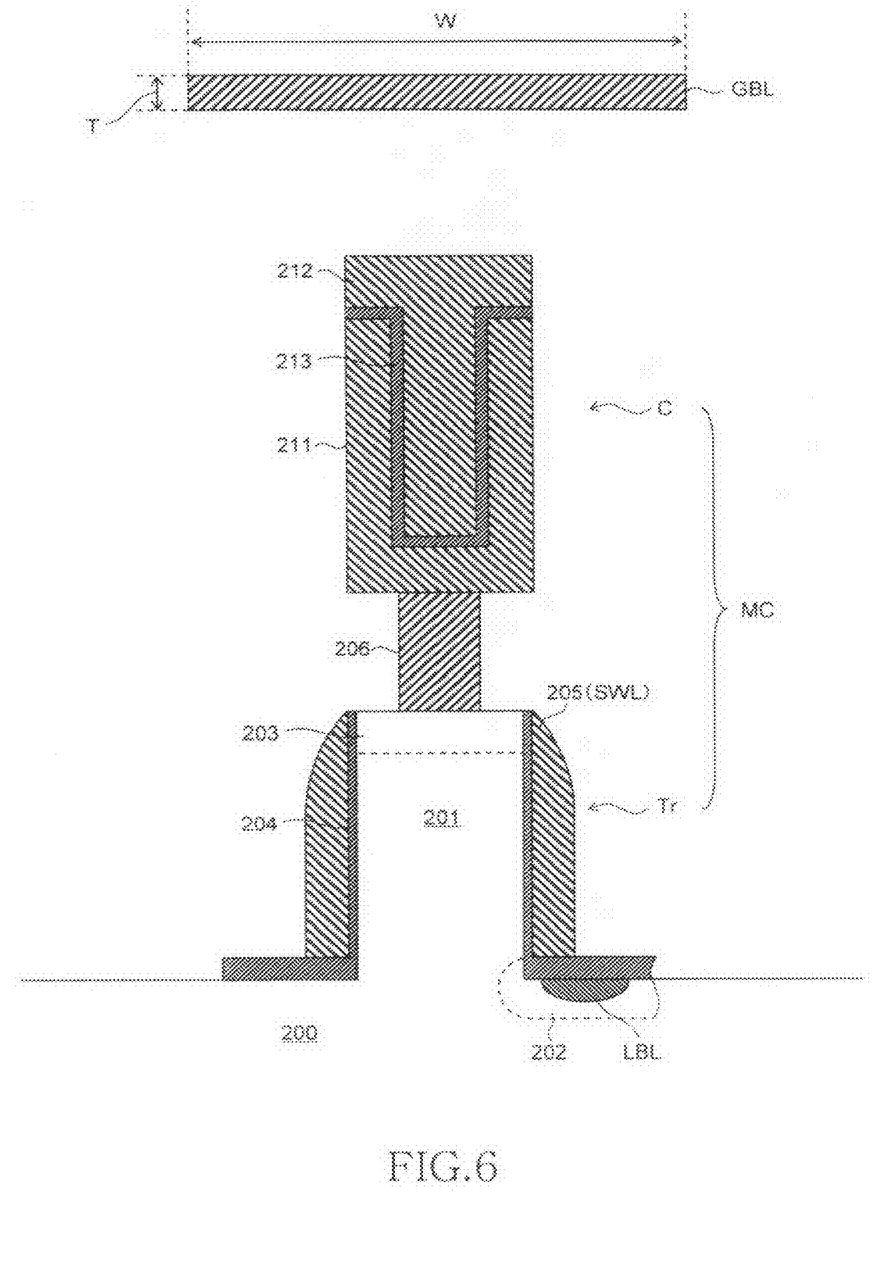
FIG. 6 is a cross section showing a physical structure of the memory cell MC.

FIG. 6 is a cross section showing a physical structure of the memory cell MC.

As shown in FIG. 6, in the present embodiment, the memory cell MC is composed of a series circuit of one cell transistor Tr (an access transistor) and one cell capacitor C (a memory element) as an example. The cell transistor Tr is a pillar MOS transistor (a vertical transistor) having a pillar-shaped channel 201 that is perpendicular to a main plane of a semiconductor substrate 200. On the bottom and the top of the pillar-shaped channel 201, diffusion layers 202 (the local bit line LBL) and 203 (storage contact side of the memory cell MC) are provided, respectively, and a lateral side of the pillar-shaped channel 201 is surrounded by a gate electrode 205 via a gate insulating layer 204. With this configuration, when a predetermined voltage is applied to the gate electrode 205, the upper and the lower diffusion layers 202 and 203 are electrically connected to each other. The gate electrode 205 functions as the sub-word line SWL. With this structure, it is possible to form one memory cell MC in an area of $4F^2$ (where F is the minimum feature size). A $4F^2$ memory cell MC is a 1-intersection 1-cell type in which a memory cell is arranged at every intersections of the sub-word line SWL with the local bit line LBL. An arrangement pitch of the local bit line LBL of the $4F^2$ memory cell MC may be smaller than an arrangement pitch of the local bit line of the memory cell MC of a $6F^2$ type or higher. In this case, it is also desirable to configure the hierarchy switch that is constituted by a transistor attached to the local bit line LBL with the same vertical transistor as the access transistor of the memory cell MC. Therefore, the ON resistance of the vertical transistor (hierarchy switch) in the ON state increases higher than the ON resistance of the hierarchy switch attached to the local bit line LBL of the memory cell MC of the $6F^2$ type or higher having a large arrangement pitch. Because a large number of access transistors are connected to the local bit line, the load (distributed constant) of the hierarchy switch and the local bit line viewed from the global bit line (or viewed from the sense amplifier) is considerably heavier than the load of the global bit line in a total. Because all the sub-word lines can be used as effective sub-word lines in the $4F^2$ memory cell MC, for example, it is not necessary to set word lines arranged in every two lines as the dummy word lines.

The lower diffusion layer 202 is connected to the local bit line LBL that is embedded in the semiconductor substrate 200. In this manner, in the present embodiment, because the local bit line LBL is embedded in the semiconductor substrate 200, a cross coupling of the local bit line LBL and the sub-word line SWL is remarkably small compared to a case of using a normal planar transistor. Therefore, in the present embodiment, it is less necessary to deliver the word line noise to the local bit line LBL of the reference side by using the dummy word line. This is why the dummy word line is not employed in the present embodiment. The diffusion layer 202 (the local bit line LBL) can be made of an arsenic (As) doped polycrystalline silicon, tungsten, or other metal materials.

The upper diffusion layer 203 (a storage contact side of the memory cell MC) is connected to a lower electrode 211 of the cell capacitor C via a contact plug 206. The cell capacitor C includes the lower electrode 211, an upper electrode 212, and a capacitor insulating layer 213 formed between the lower electrode 211 and the upper electrode 212. The upper electrode 212 is connected to a predetermined fixed potential. The global bit line GBL is formed above the cell capacitor C. The global bit line GBL is formed using an upper layer line, and a line pitch of the global bit line GBL can be equal to or two times a line pitch of the local bit line LBL. Therefore, it is possible to set a line width W of the global bit line GBL sufficiently thick. In addition, because the upper layer line is used for the global bit line GBL, a thickness T of the line also increases. Furthermore, it is possible to use copper (Cu) having a low electrical resistance as the material for the global bit line GBL. As a result, it is possible to set a line resistance (specific resistance per unit length) of the global bit line GBL sufficiently lower than that of the local bit line LBL.

The configuration of the semiconductor device according to the present embodiment is as described above. An operation of the semiconductor device according to the present embodiment is explained next.

Figure 7:
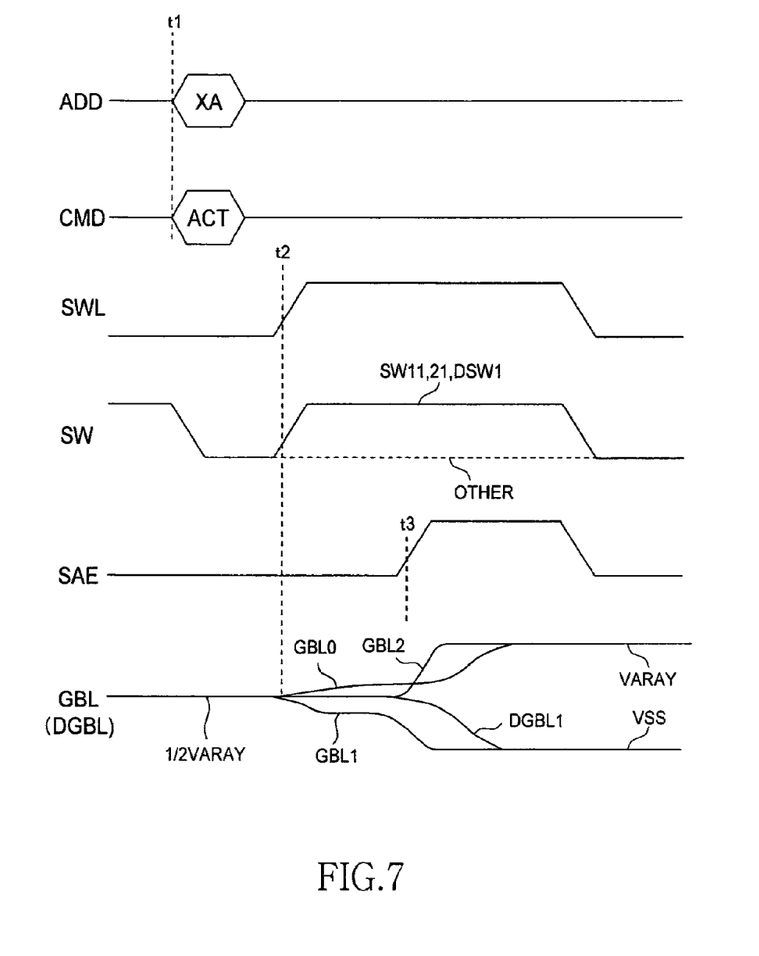
FIG. 7 is an example of a timing chart for explaining an operation of the semiconductor device according to the present embodiment.

FIG. 7 is an example of a timing chart for explaining an operation of the semiconductor device according to the present embodiment.

First, in a state before a row address XA is input, all the global bit lines GBL and the local bit lines LBL are pre-charged to a predetermined potential (for example, VARAY/2, where VARAY is a voltage of a high voltage side of the sense amplifier, for example, 1.2 V (volts)) for a predetermined time by a bit line pre-charge circuit (not shown). The same operation is also performed for the dummy global bit line DGBL and the dummy local bit line DLBL1. It is preferable to pre-charge from the global bit line GBL side and the dummy global bit line DGBL side in a state in which all the hierarchy switches SW are switched on. It is because a low resistance in the ON state can be realized with a transistor having the same structure as the transistor structure constituting the sense amplifier of which the ON resistance in the ON state is low. The global bit line GBL represents a potential at the sense amplifier SA.

As shown in FIG. 7, if an active command ACT and a row address XA are input at a time t1, a corresponding sub-word line SWL is activated at a time t2. In the present example, the activated sub-word line SWL belongs to, as shown in FIG. 3A, the memory block MB11 included in the memory mat MAT1. That is, the memory block MB11 is the access side block.

At the time t2, hierarchy switches SW are activated based on the row address X7 to X10 (or more). One of the hierarchy switches activated is a hierarchy switch SW11 corresponding to the memory block MB11 that is the access side block, and the others are a hierarchy switch SW21 and the dummy hierarchy switch DSW1 corresponding to the memory blocks MB21 and the dummy memory block DMB1 that are the reference side blocks, respectively. With this operation, each of the global bit lines GBL0 and GBL1 shown in FIG. 2 is connected to the memory cell MC via its corresponding local bit line LBL. On the other hand, the global bit line GBL2 is connected to its corresponding local bit line LBL, but is not connected to a memory cell or a dummy cell. While the dummy global bit line DGBL1 is connected to its corresponding dummy local bit line DLBL1, it is not connected to a memory cell or a dummy cell.

When the hierarchy switches SW are activated, each of potentials of the global bit lines GBL0 and GBL1 on the access side is changed based on information stored in the memory cell MC. Specifically, if the cell capacitor C is charged to a low level, the potential of the global bit line GBL is slightly decreased, and if the cell capacitor C is charged to a high level, the potential of the global bit line GBL is slightly increased. In the example shown in FIG. 7, the potential of the global bit line GBL0 is increased, and the potential of the global bit line GBL1 is decreased.

The sense amplifier SA performs amplification of the dummy global bit line DGBL1 as the reference side for the global bit line GBL0, and performs amplification of the global bit line GBL2 as the reference side for the global bit line GBL1. As described above, the length of the dummy global bit line DGBL is shorter than the length of the global bit line GBL. However, because a component due to the local bit line LBL (the dummy local bit line DLBL1) and the hierarchy switch SW (the dummy hierarchy switch DSW) is dominant in the parasitic CR distributed constant viewed from the sense amplifier SA, a difference between the lengths of the dummy global bit line DGBL and the global bit line GBL does not have much influence on the sensing operation. Specifically, the most important time here is a time of sensing a slight potential difference at the time t3 (an initial period after starting the sensing: initial sensing stage). A dominant load model viewed from the sense amplifier (based on the sense amplifier) is load models (parasitic CR models) of both a reference side local bit line to be added to the reference side global bit line and an access side local bit line to be added to the access side global bit line, which are completely consistent with each other. It is because values of On resistances of the hierarchy switches of the both sides to be switched on are higher than a value of a parasitic resistance of the global bit line, with reference to the sense amplifier. Therefore, at the initial sensing stage, the sense amplifiers can operate with the substantially same load model.

However, because a line resistance of the global bit line GBL is not zero, there is a possibility that the difference in length affects the parasitic CR distributed constant although it is a small amount. It is because a ratio of resistances of the hierarchy switch and the global bit line depends on the number of memory blocks MB. In the present embodiment, when sensing the global bit lines GBL together, such a small amount of difference is taken into consideration. That is, in the present embodiment, because one of the memory blocks MB that are located in a mirror arrangement with respect to the sense amplifier array SAA becomes the access side and the other becomes the reference side, the parasitic CR models of the global bit lines GBL of the access side and the reference side become completely equal to each other.

For example, in the viewpoint of the distance from the sense amplifier to the selected hierarchy switch, the load model of the sense amplifier SA0 is different from the load model of the sense amplifier SA1. However, what is important is that the load models of the access side and the reference side of an individual sense amplifier are the same at the initial sensing stage. For example, it is important that balances of four vectors are consistent with each other, including a first vector with which the sense amplifier that is composed of a CMOS tries to charge the global bit line of the access side to the high level, a second vector with which the sense amplifier tries to charge the global bit line of the access side to the low level, a third vector with which the sense amplifier tries to charge the global bit line of the reference side to the high level, and a fourth vector with which the sense amplifier tries to charge the global bit line of the reference side to the low level. Each of the four vectors is greatly influenced by its corresponding load model. It is a very important technical concept to sense a voltage difference equal to or smaller than 0.1 V. In the present embodiment, it can be expressed that the load model of a hierarchy switch to be switched on viewed from the farthest sense amplifier SA0 is heavier than the load model viewed from the sense amplifier SA1. For example, assume that a differential potential in the sense amplifier SA0 at the time of starting a sensing (an initial time after starting a sensing) is 50 mV (millivolts) and a differential potential in the sense amplifier SA1 is 60 mV (it is assumed that both the sense amplifiers SA0 and SA1 can sense up to a differential potential of 30 mV without introducing errors). However, if the above four vectors of the sense amplifier SA0 are consistent with each other, the sense amplifier SA0 can perform the sensing of 50 mV at a first speed without introducing errors. If the above four vectors of the sense amplifier SA1 are consistent with each other, the sense amplifier SA1 can perform the sensing of 60 mV at a second speed without introducing errors. The first speed is slightly slower than the second speed. However, what the present invention puts a focus on is the sensitivity (balance) at the initial sensing stage.

After a sufficient potential difference appears on each of the global bit lines GBL, a sense amplifier activation signal SAE is activated at a time t3, by which the sense amplifier SA begins a sensing operation. With this operation, the potential of the global bit line GBL0 of the access side is increased to VARAY, and the potential of the dummy global bit line DGBL1 of the reference side, which makes a pair with the global bit line GBL0, is decreased to VSS. Similarly, the potential of the global bit line GBL1 of the access side is decreased to VSS, and the potential of the global bit line GBL2 of the reference side, which makes a pair with the global bit line GBL1, is increased to VARAY.

A system to which the present invention is applied is explained next.

Figure 8:
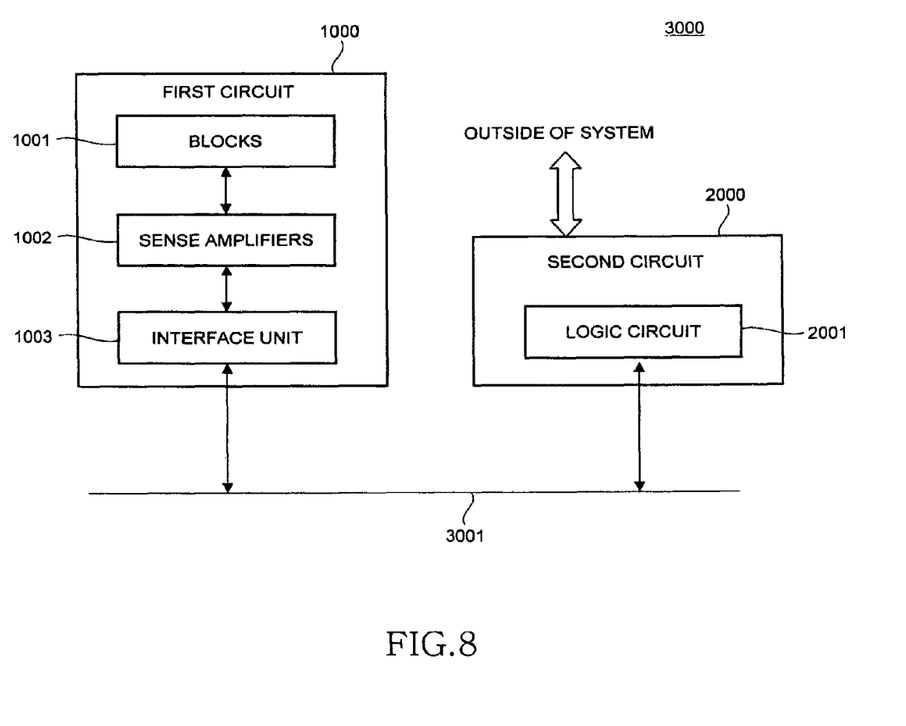
FIG. 8 is block diagram of system employing the semiconductor device according to the present embodiment.

FIG. 8 is block diagram of system employing the semiconductor device according to the present embodiment. The present invention constitutes a system 3000. The system 3000 includes a first circuit 1000 corresponding to the circuit shown in FIG. 1 and a second circuit 2000 that controls the first circuit. The second circuit has a function of communicating with the outside of the system and a function of communicating with other circuits (not shown) in the system. The second circuit 2000 includes a logic circuit 2001 for controlling the first circuit. The first circuit 1000 includes an interface unit 1003 for communicating with the second circuit, a plurality of blocks 1001 having a plurality of pieces of information, a plurality of sense amplifiers 1002 each sensing each of the pieces of information, a plurality of decoders (not shown) corresponding to the circuits shown in FIG. 4, and other control circuits required for an access. A bus 3001 in the system is a signal line for transferring the pieces of information, including a plurality of control signals required for the first circuit and the second circuit to communicate the information. The second circuit has a function of accessing the pieces of information of the first circuit. This system 3000 has a performance of processing the information with a high sensing sensitivity as described above.

The first circuit and the second circuit are formed on the same semiconductor substrate or on different semiconductor substrates from each other. The first circuit and the second circuit can be sealed with the same packaging material or different packaging materials from each other. The first circuit and the second circuit can be mounted in a layered structure or can be planar mounted. This system 3000 can include a circuit having the other function (a third circuit).

As described above, according to the present embodiment, by allocating a dummy memory block DMB to a memory mat that is located at an edge, it is possible to match the memory capacity of the memory mat that is located at the edge and the memory capacity of the other memory mat each other.

It is apparent that the present invention is not limited to the above embodiments, but may be modified and changed without departing from the scope and spirit of the invention.

For example, in the above embodiment, when a memory mat that is not located at an edge is selected, the access side memory block and the reference side memory block are allocated symmetrically with respect to the sense amplifier array SAA so that distances from the sense amplifier to the hierarchy switches to be activated along the global bit line GBL becomes equal to each other; however, this is not essential in the present invention.

Furthermore, in the above embodiment, although the addresses of the memory mat MAT and the memory block MB are allocated symmetrically with respect to the sense amplifier array SAA, this is not essential in the present invention. However, in a case where the addresses are not allocated symmetrically, it is necessary to perform an address conversion to select a hierarchy switch SW of the reference side in such a manner that the distance from the sense amplifier SA to the hierarchy switch SW to be activated along the global bit line GBL is substantially equal in the access side and the reference side.

Moreover, in the above embodiment, although a case where the present invention is applied to a DRAM is explained as an example, the target of the present invention is not limited to DRAMs, and the present invention can be widely applied to other types of semiconductor devices. For example, a nonvolatile element (such as a PRAM employing a phase change memory element) can be used instead of the cell capacitor C.

The basic technical concept of the present is not limited to the above method, and the format of each of the circuits is not limited to the circuit format described in the above embodiment. The circuit configuration of the sense amplifier is no object as far as it is a differential type. A differential sense amplifier in which the global bit line of the access side and the global bit line of the reference side are input to single end type gates, respectively, can be also applied. Furthermore, the equalize voltage of the bit line is not limited to VARAY/2, but can be a low voltage at the VSS side or a high voltage at the VARAY side. Moreover, if the transistor is an FET (Field Effect Transistor), it is possible to use various FETs, such as an MIS (Metal-Insulator Semiconductor) and a TFT (Thin Film Transistor) as well as an MOS (Metal Oxide Semiconductor) transistor. In addition, a bipolar transistor can be also used.

The present invention can be applied to semiconductor devices such as a memory, a CPU (Central Processing Unit), an MCU (Micro Controller Unit), or a DSP (Digital Signal Processor). In addition, an NMOS transistor (N-channel MOS transistor) is a representative example of a first conductive transistor, and a PMOS transistor (P-channel MOS transistor) is a representative example of a second conductive transistor.

Further, many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
    a first global bit line;
    a dummy global bit line;
    a plurality of first memory blocks that are arranged in a first direction, each of the plurality of first memory blocks including a first hierarchy switch that is connected to the first global bit line, and a first local bit line that is connected to the first global bit line via the first hierarchy switch;
    a dummy memory block including a dummy hierarchy switch that is connected to the dummy global bit line, and a first dummy local bit line that is connected to the dummy global bit line via the dummy hierarchy switch;
    a first sense amplifier that is arranged between the first memory blocks and the dummy memory block, and amplifies a potential difference between the first global bit line and the dummy global bit line;
    a control circuit that controls the first hierarchy switches and the dummy hierarchy switch such that any one of a plurality of first hierarchy switches and the dummy hierarchy switch are brought into an on state,
    wherein a total number of memory cells connected to a plurality of the first local bit lines corresponding to the first sense amplifier is greater than a total number of dummy memory cells connected to the dummy local bit line corresponding to the first sense amplifier,
    wherein a length of the first local bit line is substantially equal to a length of the first dummy local bit line,
    wherein a length of the first global bit line is longer than a length of the dummy global bit line,
    a second global bit line and a third global bit line;
    a plurality of second memory blocks that are arranged in the first direction, each of the second memory blocks including a second hierarchy switch that is connected to the second global bit line, and a second local bit line that is connected to the second global bit line via the second hierarchy switch; and
    a second sense amplifier that is arranged between the first memory blocks and the second memory blocks and amplifies a potential difference between the second and third global bit lines,
    wherein the first memory blocks are arranged between the first and second sense amplifiers,
    wherein each of the first memory blocks further includes a third hierarchy switch that is connected to the third global bit line, and a third local bit line that is connected to the third global bit line via the third hierarchy switch, and
    wherein the control circuit activates any one of a plurality of the first hierarchy switches, any one of a plurality of the second hierarchy switches, any one of a plurality of the third hierarchy switches, and the dummy hierarchy switch.

2. The semiconductor device as claimed in claim 1, wherein the dummy memory block further includes a second dummy local bit line that is not connected to the dummy global bit line and constantly supplied with a fixed potential.

3. The semiconductor device as claimed in claim 2, further comprising an equalizer circuit that supplies the fixed potential to the second dummy local bit line.

4. The semiconductor device as claimed in claim 3, wherein the dummy memory block is arranged between the first sense amplifier and the equalizer circuit.

5. The semiconductor device as claimed in claim 1, wherein
    a plurality of the memory cells are allocated to each of a plurality of the first local bit lines,
    an external address is allocated to each of the memory cells,
    a plurality of the dummy memory cells are allocated to the first dummy local bit line,
    and no external address is allocated to the dummy memory cells.

6. The semiconductor device as claimed in claim 1, wherein each of the memory cells has substantially a same structure as each of the dummy memory cells.

7. The semiconductor device as claimed in claim 5, wherein:
    each of the memory cells and the dummy memory cells includes a series circuit of a cell transistor and a memory element, and
    the control circuit brings the cell transistor of any one of the memory cells into the on state so as to electrically connect a corresponding memory element to a corresponding one of the first local bit lines, while not connecting the memory element of any one of the dummy memory cells to the first dummy local bit line.

8. The semiconductor device as claimed in claim 5, wherein a number of the dummy memory cells allocated to the first dummy local bit line is equal to a number of the memory cells allocated to each of the first local bit lines.

9. The semiconductor device as, claimed in claim 5, wherein:
    each of the memory cells and the dummy memory cells includes a series circuit of a cell transistor and a memory element, and the cell transistor is constituted by a pillar MOS transistor having a pillar-shaped channel that is substantially perpendicular to a main surface of a semiconductor substrate.

10. The semiconductor device as claimed in claim 9, wherein:
the first local bit lines and the first dummy local bit line are embedded in the semiconductor substrate, and
the first global bit line and the dummy global bit line are formed on the semiconductor substrate.

11. The semiconductor device as claimed in claim 1, wherein the control circuit activates the second and third hierarchy switches having substantially a same distance from the second sense amplifier along the second and third global bit lines, respectively.

12. The semiconductor device as claimed in claim 1, wherein:
a plurality of the memory cells are allocated to each of a plurality of the second and third local bit lines,
an external address is allocated to each of the memory cells,
each of the memory cells includes a series circuit of a cell transistor and a memory element, and
the control circuit brings the cell transistor of any one of the memory cells corresponding to the third local bit lines into the on state so as to electrically connect a corresponding memory element to the third local bit line, while not connecting the memory elements included in the second memory blocks to the second local bit lines.

13. The semiconductor device as claimed in claim 12, wherein:
a plurality of the memory cells are allocated to each of a plurality of the first local bit lines,
an external address is allocated to each of the memory cells,
a plurality of the dummy memory cells are allocated to the first dummy local bit line,
no external address is allocated to the dummy memory cells, and
the control circuit brings a cell transistor of any one of the memory cells corresponding to the first local bit lines into the on state so as to electrically connect a corresponding memory element to the first local bit line, while not connecting the memory elements included in the dummy memory block to the first dummy local bit line.

14. A semiconductor device comprising:
a memory mat array including a plurality of memory mats arranged in one direction, each of the memory mats being divided into a plurality of memory blocks;
a first dummy memory block and a second dummy memory block that are arranged at outer sides of one end and another end of the memory mat array in the one direction, respectively;
a plurality of global bit lines each being allocated to each of the memory mats, the global bit lines including at least a first global bit line and a second global bit line;
a first dummy global bit line and a second dummy global bit line that are allocated to the first and second dummy memory blocks, respectively, wherein a length of each of the first and second dummy global bit lines is shorter than a length of each of the global bit lines;
a first sense amplifier that is arranged between the first dummy memory block and a first memory mat of the plurality of memory mats that is located at the one end of the memory mat array, and amplifies a potential difference between the first dummy global bit line and the first global bit line allocated to the first memory mat;
a second sense amplifier that is arranged between the second dummy memory block and a second memory mat of the plurality of memory mats that is located at the another end of the memory mat array, and amplifies a potential difference between the second dummy global bit line and the second global bit line allocated to the second memory mat; and
a control circuit that controls the plurality of memory mats and the first and second dummy memory blocks, wherein:
each of the memory blocks included in the memory mats includes a local bit line, a hierarchy switch that connects the local bit line and the global bit line corresponding to the local bit line, a plurality of memory cells that are allocated to the local bit line, and a plurality of word lines for connecting any one of the memory cells to the local bit line, each of the word lines being allocated to an associated one of the memory cells,
the first dummy memory block includes a first dummy local bit line, and a first dummy hierarchy switch that connects the first dummy local bit line and the first dummy global bit line,
the second dummy memory block includes a second dummy local bit line, and a second dummy hierarchy switch that connects the second dummy local bit line and the second dummy global bit line,
a total number of memory cells connected to a plurality of local bit lines allocated to one of the sense amplifiers in the memory mat is larger than a total number of dummy memory cells connected to a corresponding one of the first dummy local bit line or the second dummy local bit line,
a length of the local bit line is substantially equal to a length of each of the first and second dummy local bit lines, and
a length of the global bit line is longer than a length of each of the first and second dummy global bit lines.

15. The semiconductor device as claimed in claim 14, wherein a length of each of the first and second dummy memory blocks in the one direction is shorter than a length of each of the memory mats in the one direction.

16. The semiconductor device as claimed in claim 14, wherein a length of each of the first and second dummy memory blocks in the one direction is substantially equal to a length of each of the memory blocks in the one direction.

17. The semiconductor device as claimed in claim 14, wherein:
when the control circuit selects any one of the word lines of any one of memory blocks included in the first memory mat, the control circuit performs an access operation using the first sense amplifier by activating the hierarchy switch corresponding to the word line and activating the first dummy hierarchy switch of the first dummy memory block, and
when the control circuit selects any one of the word lines of any one of memory blocks included in the second memory mat, the control circuit performs an access operation using the second sense amplifier by activating the hierarchy switch corresponding to the word line and activating the second dummy hierarchy switch of the second dummy memory block.

18. The semiconductor device as claimed in claim 14, further comprising:
a third sense amplifier arranged between the first and a third memory mats of the plurality of memory mats; and
a fourth sense amplifier arranged between the second and a fourth memory mats of the plurality of memory mats, wherein:

the plurality of global bit lines further include a third global bit line allocated to the first memory mat, a fourth global bit line allocated to the third memory mat, a fifth global bit line allocated to the second memory mat, and a sixth global bit line allocated to the fourth memory mat, the third sense amplifier amplifies a potential difference between the third and fourth global bit lines, the fourth sense amplifier amplifies a potential difference between the fifth and sixth global bit lines, when the control circuit selects any one of the word lines of a memory block included in the first memory mat, the control circuit performs an access operation using the first sense amplifier by activating the hierarchy switches corresponding to the word line and activating the first dummy hierarchy switch of the first dummy memory block, and performs an access operation using the third sense amplifier by activating the hierarchy switch of a memory block in the third memory mat, which is located at a symmetric position to the memory block that is selected across the third sense amplifier, and when the control circuit selects any one of the word lines of a memory block included in the second memory mat, the control circuit performs an access operation using the second sense amplifier by activating the hierarchy switches corresponding to the word line and activating the second dummy hierarchy switch of the second dummy memory block, and performs an access operation using the fourth sense amplifier by activating the hierarchy switch of a memory block in the fourth memory mat, which is located at a symmetric position to the memory block that is selected across the fourth sense amplifier.

* * * * *